United States Patent [19]

Lichtel, Jr. et al.

[11] Patent Number: 4,818,725
[45] Date of Patent: Apr. 4, 1989

[54] TECHNIQUE FOR FORMING PLANARIZED GATE STRUCTURE

[75] Inventors: Richard L. Lichtel, Jr.; Lawrence G. Pearce, both of Palm Bay; Dryer A. Matlock, Melbourne, all of Fla.

[73] Assignee: Harris Corp., Melbourne, Fla.

[21] Appl. No.: 224,320

[22] Filed: Jul. 26, 1988

Related U.S. Application Data

[63] Continuation of Ser. No. 907,007, Sep. 15, 1986, abandoned.

[51] Int. Cl.⁴ .................. H01L 21/22; H01L 21/265
[52] U.S. Cl. ........................................ 437/203; 437/63; 437/186; 437/233; 148/DIG. 50; 148/DIG. 86; 148/DIG. 122; 148/DIG. 131; 156/640; 156/643; 156/651; 156/644; 357/23.11; 357/23.9; 357/49; 357/59
[58] Field of Search .............. 437/203, 63, 186, 233; 357/23.11, 23.9, 49, 59; 148/DIG. 50, DIG. 86, DIG. 122; 156/640, 643, 644, 651

[56] References Cited

U.S. PATENT DOCUMENTS

| | | | |
|---|---|---|---|
| 4,354,897 | 10/1982 | Nakajima | 156/643 |
| 4,356,040 | 10/1982 | Fu et al. | 148/1.5 |
| 4,356,623 | 11/1982 | Hunter | 437/44 |
| 4,371,403 | 2/1983 | Ikubo et al. | 148/1.5 |
| 4,373,965 | 2/1983 | Smigelski | 148/1.5 |
| 4,433,468 | 2/1984 | Kawamata | 437/34 |
| 4,435,896 | 3/1984 | Parillo et al. | 437/34 |
| 4,439,270 | 3/1984 | Powell et al. | 156/644 |
| 4,512,073 | 4/1985 | Hsa | 437/187 |
| 4,536,943 | 8/1984 | Kakuma | 437/41 |

Primary Examiner—Brian E. Hearn
Assistant Examiner—Beverly A. Pawlikowski
Attorney, Agent, or Firm—Antonelli, Terry & Wands

[57] ABSTRACT

A direct moat wafer processing for maximizing the functional continuity of a field oxide layer employs a processing sequence through which respective differently sized apertures are successively formed in the oxide layer. A first of these apertures prescribes the size of the polysilicon gate, while a second aperture is formed around the completed gate structure and prescribes the geometry of source/drain regions to be introduced into exposed surface areas of the substrate on either side of the gate. The sidewalls of the first and subsequently formed, second aperture are effectively perpendicular to the substrate surface, thereby maintaining the functional continuity of the field oxide layer across the entirety thereof. Thereafter, a separate gate interconnect layer is selectively formed atop the field oxide layer to provide a conductive path to the gate.

17 Claims, 5 Drawing Sheets

TECHNIQUE FOR FORMING PLANARIZED GATE STRUCTURE

This is a continuation of application Ser. No. 907,007, filed Sept. 15, 1986, abandoned.

FIELD OF THE INVENTION

The present invention relates in general to the manufacture of semiconductor devices and, in particular, to a technique for preventing the formation of polysilicon stringers adjacent to the sidewalls of the aperture in a direct moat field oxide layer, through which oxide layer regions of a field effect device are formed.

BACKGROUND OF THE INVENTION

The surface configuration of an integrated circuit device, particularly one employing silicon as the bulk material of the substrate wherein device regions are formed, will vary depending upon the type of surface passivation processing employed. For example, recess or trench-processed substrates and LOCOS (Local oxidation of silicon) -formed structures have an undulating surface configuration, while devices formed using direct moat processing techniques are effectively planar-surfaced. Because of the variations in thickness of field insulator material or change in surface shape of the bulk of an integrated circuit device manufactured using the former two techniques, integration density and immunity to external influences (e.g. radiation hardness) of the resulting structures are reduced compared with a planar-surfaced structurre formed by direct moat (e.g. via a field oxide) processing. For a discussion of the above-referenced techniques and their effects on integrated circuit manufacture, attention may be directed to an article by K.L. Wang et al entitled "Direct Moat Isolation for VLSI", published by the IEEE in IEDM 81, pages 372-375.

As described in the Wang et al article, direct moat wafer processing has recently been recognized as offering a number of advantages over previous methodologies for processing large scale integrated circuits. In the manufacture of circuits containing field effect devices, the field oxide that is formed on the planar surface of the substrate and used to prevent the creation of unwanted parasitic devices beneath overlying interconnect material (e.g. metal, polysilicon), has formed therein apertures or windows through which dopants for forming device regions are introduced, and within which gate electrodes (e.g. polysilicon) are provided.

An illustration of an exemplary embodiment of an apertured field oxide layer for forming a field effect device in a semiconductor (e.g. silicon) substrate using direct moat processing is shown in FIGS. 1-8, of which FIGS. 1, 3, 5 are plan views of the device, while FIGS. 2, 4, 6 are sectional views taken along line A—A' of FIGS. 1, 3, 5, respectively. FIG. 7 is a sectional view taken along line B—B' of FIG. 3, while FIG. 8 is a sectional view taken along C—C' of FIG. 3. As shown in FIGS. 1 and 2, a (silicon) substrate 10 having a planar surface 11 has a field oxide layer 12 formed thereon (typically to a thickness on a order of 5000-6000Å). Field oxide layer 12 has an aperture or window 13 formed therein exposing a surface region 14 of the planar surface 11 of substrate 10. The sidewalls 15 of window 13 are effectively perpendicular to planar surface 11, so as to allow subsequent formation of an insulative spacer thereat.

Next, as illustrated in FIGS. 3 and 4, following the formation of a thin dielectric (gate oxide) layer 21 (having a thickness on the order of 100–400Å), gate electrode material (e.g. polysilicon) 25 is nonselectively formed on the top surface 16 of the field oxide layer 12 and on the gate oxide layer 21 within the entirety of the aperture 13. The layer 25 of polysilicon gate material is selectively etched to form a gate electrode 26 which, as shown in FIGS. 5 and 6, overlies the top surface 16 of field oxide layer 12 and extends onto thin gate oxide layer 21. During this step, that portion of the polysilicon layer 25 whereat the gate electrode 26 is to be formed is masked and the exposed polysilicon layer in a direction normal to the surface 11 of substrate 10 down to the surface of field oxide 12 and substrate surface 11, partly removing exposed surface portions of the thin gate oxide layer 21 adjacent to the masked polysilicon gate 26 and the field oxide layer 12. Complete removal of the gate oxide 21 results in etching of the substrate 10 and results in device damage. This constraint limits the etch of the polysilicon.

More particularly, the etch of the polysilicon proceeds uneventfully until a thickness t in FIG. 5 is removed. At that point the gate oxide 21 becomes exposed to the etch environment in those regions away from the field xoide edge 15. Once exposed the gate oxide begins to etch. Should all of the gate oxide be etched away, the etch will proceed into the silicon substrate and destroy the device. Stopping the etch before this occurs will, for typical values of gate and field oxides, leave some of the polysilicon having thickness T around the oxide wall. This residual is an unwanted polysilicon stringer 30. Thus the stringer results from two compounding effects. First, the field oxide wall creates wall of polysilicon with thickness T greater than the flat film thickness t. Second, the etch is limited in extent by the penetration of the gate oxide under the thinner polysilicon.

In our copending U.S. patent application entitled "Technique for Elimination of Polysilicon Stringers in Direct Moat Field Oxide Structure", U.S. Ser. No. 841,297, filed Mar. 19, 1986 and assigned to the Assignee of the present application, there is disclosed a scheme for solving the problem of the unwanted residual polysilicon stringer along the sidewall of the aperture in a field oxide layer employed in direct moat wafer processing. Pursuant to that inventive processing technique, the sidewall of the aperture in the field oxide layer is initially sloped prior to formation of the polysilicon layer to be used for the gate electrode(s). Because of the taper or slope of the sidewall of the field oxide layer, the thickness of the polysilicon layer formed thereon is substantially uniform over the entirety of the substrate. As a result, during subsequent selective etching of the polysilicon layer to define the gate electrode(s), all unmasked portions of the polysilicon are completely etched, leaving no residual material (e.g. stringer) that could be a source of device contamination. After the polysilicon gate has been delineated, the sloped sidewall of the aperture in the field oxide is removed (by anisotropic etching), so that the sidewall of the aperture or window of the field oxide layer will be perpendicular to the planar surface of the substrate, thereby ensuring the requisite functional continuity throughout substantially the entire portion of the field oxide adjacent the aperture therein.

In the completed structure the only portion of the field oxide that has a reduced thickness is that original tapered portion lying directly beneath the polysilicon gate. While this small region is not necessarily a catastrophic problem in terms of functional continuity of the field oxide layer, it would be preferred that no portion of the field oxide layer have a tapered thickness, so as to effectively completely obviate any potential region of reduced radiation hardness and/or leakage beneath the gate electrode.

SUMMARY OF THE INVENTION

In accordance with the present invention the a forementioned problem of an unwanted residual polysilicon stringer along the sidewall of the aperture in a field oxide layer employed for direct moat wafer processing is obviated by a processing scheme that leaves no portion of the field oxide layer of the completed structure with a tapered or sloped thickness, thereby maximizing the functional continuity of the field oxide layer. Pursuant to the present invention, rather than initially form a single aperture in the field oxide layer the size of which essentially defines the geometry of the device to be formed by the introduction of dopants through that aperture, there is provided a processing sequence through which respective differently sized apertures are successively formed in the oxide layer. A first of these apertures prescribes the size of the polysilicon gate, while a second aperture is formed around the completed gate structure and prescribes the geometry of source/drain regions to be introduced into exposed surface areas of the substrate on either side of the gate. The sidewalls of the first and subsequently formed, second aperture are effectively perpendicular to the substrate surface, thereby maintaining the functional continuity of the field oxide layer across the entirety thereof. Thereafter, a separate gate interconnect layer is selectively formed atop the field oxide layer to provide a conductive path to the gate.

Because the first aperture in the field oxide layer employed for defining the gate electrode is sized to accommodate only the gate electrode, the (polysilicon) gate electrode can be effectively planarized with the top, planar surface of the field oxide layer, thereby facilitating subsequent formation of a gate interconnect layer. Also, no unwanted gate electrode material (residual conductor layer) is formed adjacent the sidewalls of the second, larger-sized aperture that defines the geometry of the source/drain regions to be formed therethrough.

DETAILED DESCRIPTION

Figure 1:
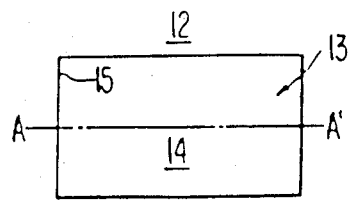
FIG. 1 is a plan view of a semiconductor structure having a conventional vertical sidewall-apertured field oxide layer to be employed in direct moat wafer processing.
Figure 2:
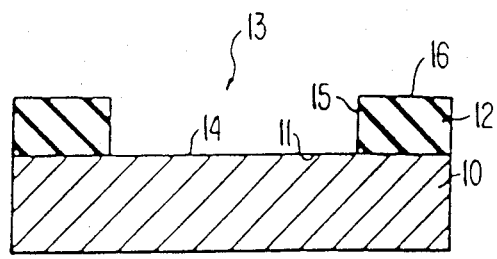
FIG. 2 is a sectional view of the semiconductor structure of FIG. 1 taken along line A—A' thereof.
Figure 3:
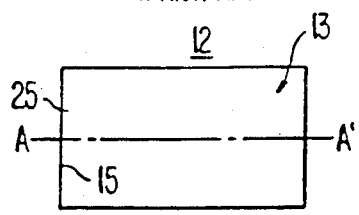
FIG. 3 is a plan view of the semiconductor structure of FIG. 1 having a layer of polysilicon thereon.
Figure 5:
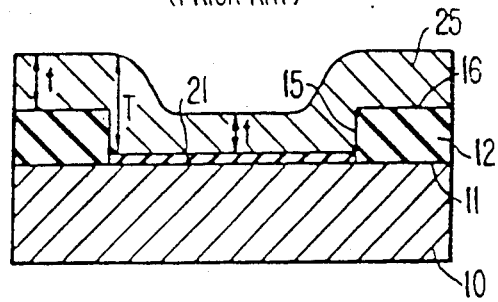
FIG. 5 is a plan view of the semiconductor structure of FIG. 3 that has been selectively etched to form a polysilicon gate electrode.
Figure 4:
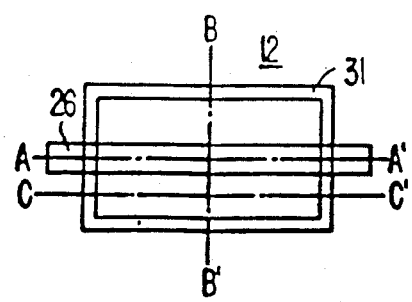
FIG. 4 is a sectional view of the semiconductor structure of FIG. 3 taken along line A—A' thereof.
Figure 6:
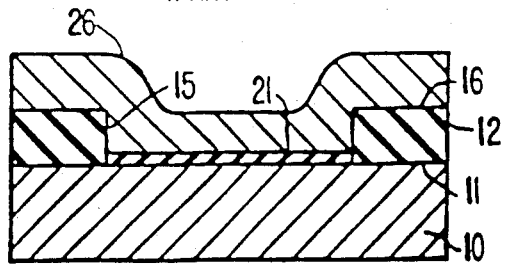
FIGS. 6, 7 and 8 are sectional views of the semiconductor structure of FIG. 5 taken along lines A—A', B—B' and C—C', thereof, respectively.
Figure 7:
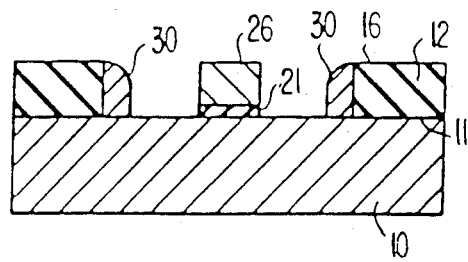
Figure 8:
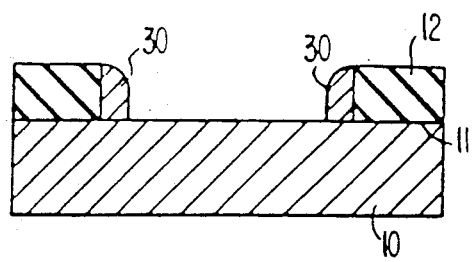
Figure 9:
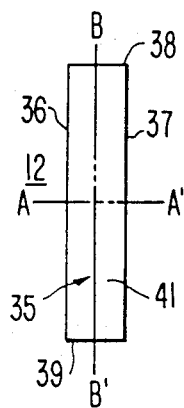
FIG. 9 is a plan view of an initial aperture in a field oxide for forming a planar gate structure therein.
Figure 10:
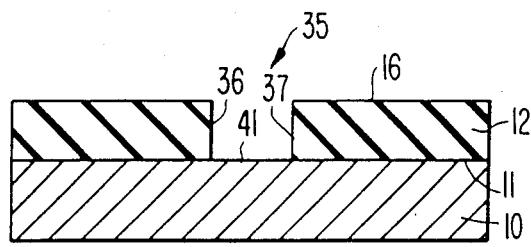
FIG. 10 is a sectional view of the apertured field oxide taken along lines A—A' of FIG. 9.
Figure 11:
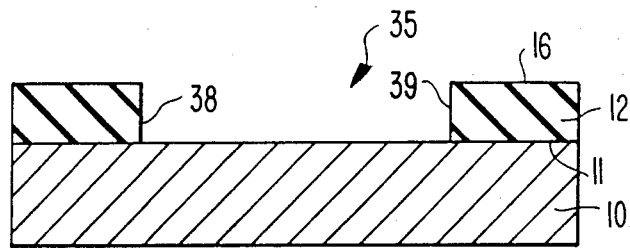
FIG. 11 is a sectional view of the apertured gate oxide taken along lines B—B' of FIG. 9.

Referring now to FIGS. 9–18, the processing steps for selectively forming a polysilicon gate electrode in a direct moat field oxide layer without unwanted polysilicon stringers and sloped sidewall portions beneath the gate electrode will be described. Initially, as shown in FIGS. 9–11, a first aperture 35 defined by a first pair of parallel sidewalls 36 and 37 and a second pair of parallel sidewalls 38 and 39, perpendicular thereto is formed in a field oxide layer 12 overlying the planar surface 11 of substrate 10. Each sidewall of aperture 35 is perpendicular to the planar surface 11 of the substrate 10 over which the field oxide layer 12 has been formed. The separation L between sidewalls 36 and 37 of aperture 36 defines the effective length of the gate (on the order of 0.75–1.25 microns) while the separation W between sidewalls 38 and 39 of aperture 35 defines the width of the gate. Aperture 35 may be formed by conventional photoresist/develop techniques followed by anisotropic etch so that the sidewalls 36–39 of the aperture 35 are substantially perpendicular to the exposed surface portion 41 of the substrate 10.

Figure 12:
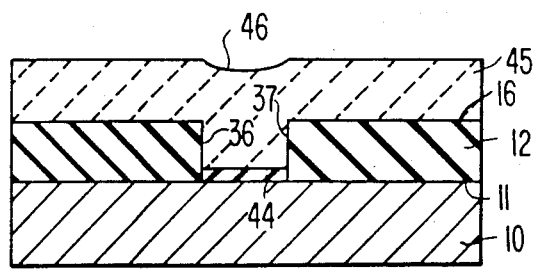
FIG. 12 is a sectional view of the structure of FIG. 10 showing a layer of polysilicon deposited therein.

Following the formation of the aperture 35 in the field oxide layer 12, a thin gate dielectric layer 44 is formed on the exposed surface portion 41 of the planar surface 11 of the substrate 10 by thermal oxidation for example, gate oxide layer 44 having a thickness on the order of 200–400Å. Next, as shown in FIG. 12, a layer of gate electrode material (e.g. polysilicon) is nonselectively deposited on the gate oxide layer 44, filling the aperture 35 and overlying the top surface 16 of the field oxide layer 12. Where the gate electrode layer 45 is comprised of polysilicon, the polysilicon may be deposited by a conventional chemical vapor deposition process. This process is carried out until the entirety of the aperture 35 is filled with the gate electrode material. In order to ensure planarization of polysilicon layer 45, the deposited polysilicon thickness should be greater than one-half the gate length L. In FIG. 12, the polysilicon layer 45 is shown as having a slight concave portion or dip 46 above the aperture 35, which concave portion results from the manner in which the aperture becomes filled with the deposited polysilicon.

Figure 13:
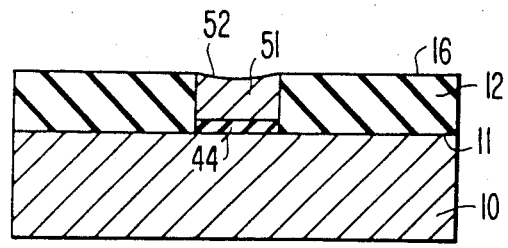
FIG. 13 is a sectional view of the structure of FIG. 12 with the polysilicon gate having been planarized.
Figure 14:
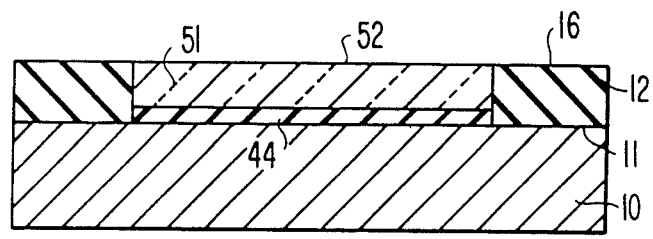
FIG. 14 is a sectional view of the structure of FIG. 13 taken along line B—B' of FIG. 9.

Thereafter, as shown in FIGS. 13 and 14, the gate electrode layer which has been nonselectively deposited over the entire surface of the apertured field oxide layer structure is subjected to an etchant which uniformly etches the material of the gate electrode layer 45. Such an etchant may comprise a conventionally employed wet polysilicon etch containing nitric and hydrofluoric acids, simple sputtering, or a reactive ion etch. The etching of layer 45 proceeds down to the surface 16 of the field oxide layer 12, so that there is obtained an effectively planarized gate electrode layer 51 completely filling the aperture 35 in the field oxide layer 12 and overlying the gate oxide layer 44. Namely, the top surface 52 of the gate electrode material 51 is substantially coplanar with the top surface 16 of the field oxide layer 12.

Figure 15:
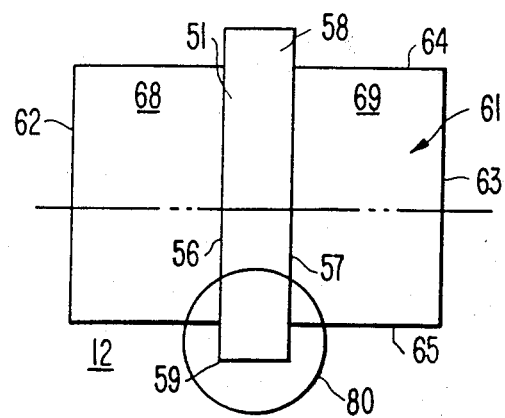
FIG. 15 is a plan view of a structure of FIGS. 13 and 14 wherein a second aperture is formed in the field oxide to overlap the planarized polysilicon gate.
Figure 16:
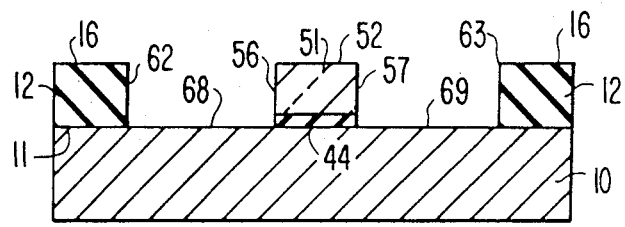
FIG. 16 is a sectionl view of the structure of FIG. 15 taken along line A—A' thereof.

Next, as shown in FIGS. 15 and 16, a second, region-defining aperture 61, which overlaps the gate electrode layer 51, is formed in the field oxide layer 12. Aperture 61 has a first pair of spaced apart parallel sidewalls 62 and 63 and a second pair of spaced apart parallel sidewalls 64 and 65, perpendicular to the first pair of sidewalls, each sidewall being perpendicular to the planar surface 11 of the substrate 10. The photolithographic procedure through which sidewalls 64 and 65 of aperture 61 are defined is such that gate electrode 51 sligthly overlaps sidewalls 64 and 65, as shown in FIG. 15. This masking step insures that there will be sufficient gate electrode material with which to form contact by way of a gate electrode interconnect, the formation of which will be described below. As a result of the formation of this second enlarged aperture 61, surface portions 68 and 69 of the planar surface 11 of substrate 10 are exposed for the introduction of source/drain region defining dopants. (Since the exact manner of forming the source/drain regions and their characteristics is not necessary for an understanding of the present invention, no further details will be given here.)

Figure 17:
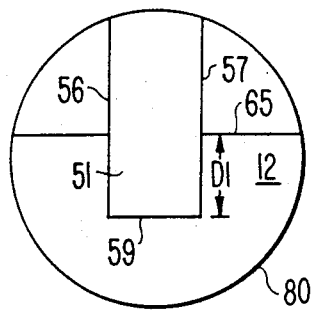
FIG. 17 is an enlarged view of that portion of FIG. 15 delineated by circle 80.

FIG. 17 shows an enlargement of the circled area 80 of the structure illustrated in FIG. 15. As mentioned above, the sidewalls 64 and 65 of aperture 61 are such that they intersect the material of the gate electrode 51, thereby insuring that the gate electrode 51 has an overlapping portion 59 thereof outside the field wall of the field oxide layer. This overlap is provided to insure the ability to provide a contact region for a gate electrode interconnect layer to be formed over the surface 16 of the field oxide layer 12. In some circumstances it may be desirable to provide enlarged tab areas at the overlapping portion. In FIG. 17, the degree of overlap is denoted by dimension D1.

Figure 18:
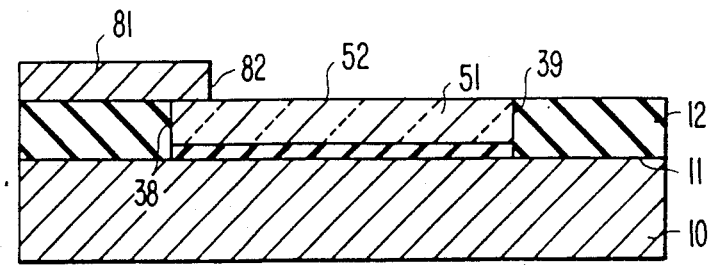
FIG. 18 is a sectional view of the structure shown in FIG. 14 whereon a layer of gate interconnect has been selectively formed.

Finally, as shown in FIG. 18, a gate interconnect layer 81 is selectively deposited over the surface 16 of the field oxide layer 12 so as to overlap the gate 51, as at surface portion 82 of overlap region 59 thereof. The material of which interconnect layer 81 is formed may be doped polysilicon or any suitable metal such as gold.

Alternatively, the formation of gate interconnect layer 81 may be accomplished prior to the etching of the field oxide. Moreover, the original etching of the gate electrode layer, described above, may be carried out as a mask etch. Namely, interconnections atop the field oxide remain as a result of the use of a protective photoresist pattern employed during the electrode etch.

Because the dimensions of the gate electrode 51 are formed prior to any subsequent region-defining processing, namely prior to the formation of the region-defining aperture 61 in the field oxide layer 12, the creation of unwanted gate electrode-material stringers as in the prior art is prevented. When the second aperture 61 through which the source/drain regions are formed in the substrate 10 is opened in the drain oxide layer 12, the gate electrode has already been completed. As a result, subseqeunt processing will not create stringers along the sidewalls of the source/drain region-defining aperture in the field oxide layer as in the prior art. Moreover, because the process according to the present invention simplifies planarization of the gate electrode, the formation of an interconnect structure thereto is facilitated.

While we have shown and described an embodiment in accordance with the present invention, it is to be understood that the same is not limited thereto but is susceptible of numerous changes and modifications as known to a person skilled in the art, and we therefore do not wish to be limited to the details shown and described herein but intend to cover all such changes and modifications as are obvious to one of ordinary skill in the art.

What is claimed is:

1. A method of manufacturing a semiconductor device comprising the steps of:
    (a) selectively forming an insulator layer on a surface of a semiconductor substrate so as to expose a first portion of said surface through a first aperture in said insulator layer, said first aperture having a sidewalls that are effectively perpendicular to the surface of said substrate;
    (b) forming a layer of conductive material in said first aperture; and
    (c) forming a second aperture in said insulator layer, said second aperture intersecting said layer of conductive material in said first aperture and exposing a surface portion of said substrate adjacent to said layer of conductive material.

2. A method according to claim 1, further comprising the step of (d) forming a conductor layer over said insulator layer so as to be electrically connected to said layer of conductive material.

3. A method according to claim 1, further including the step of, prior to step (b), forming a thin dielectric layer on said first portion of said surface of said substrate.

4. A method according to claim 3, wherein step (b) comprises the steps of:
    (b-1) non-selectively forming a layer of conductive material on said insulator layer and in the first aperture therein so as to fill said first aperture and extend over the surface of said insulator layer; and
    (b-2) removing a portion of the layer of conductive material formed in step (b-1) such that the top surface of said insulator layer is exposed and is effectively coplanar with the top surface of said layer of conductive material filling said first aperture.

5. A method according to claim 4, wherein step (b-2) comprises exposing the structure formed by step (b-1) to an etchant, so as to remove material of said layer of conductive material down to the top surface of said insulator layer.

6. A method according to claim 5, wherein the sidewalls of said first and second apertures are effectively perpendicular to the surface of said substrate.

7. A method according to claim 6, wherein said second aperture is formed so as to overlap said first aperture and intersect spaced apart sidewalls of said layer of conductive material, thereby exposing respective spaced apart surface regions of said substrate adjacent to the sidewalls of said layer of conductive material.

8. A method according to claim 7, further comprising the step of (d) forming a conductor layer over said insulator layer so as to be electrically connected to said layer of conductive material.

9. For use in a direct moat process for manufacturing a semiconductor device having a gate electrode structure formed n an aperture of a field insulator layer through which respective regions of a field effect device are formed by the introduction of dopants into the planar surface of a substrate over which said field insulator layer is formed, a method of forming said gate electrode structure comprising the steps of:

(a) selectively forming a field insulator layer on the planar surface of a substrate so as to expose a first surface portion of said planar surface through a first aperture therethrough, said first aperture having sidewalls that are effectively perpendicular to the surface of said substrate;

(b) forming a thin dielectric layer on said exposed first surface portion of said substrate;

(c) non-selectively forming a conductive layer on the structure resulting from step (b);

(d) removing material of the conductive layer formed in step (c) such that said field insulator layer is exposed and the exposed surface thereof is effectively coplanar with the top surface of said conductive layer in said first aperture; and (e) forming a second aperture in said field insulator layer, said second aperture intersecting said layer of conductive material in said first aperture and exposing a surface portion of said substrate adjacent to said layer of conductive material.

10. A method according to claim 9, wherein the sidewalls of said second aperture are effectively perpendicular to the exposed planar surface portion of said substrate.

11. A method according to claim 9, further comprising the step of (f) forming a conductor layer over said field insulator layer so as to be electrically connected to said conductive layer.

12. A method according to claim 9, wherein step (d) comprises exposing the conductive layer formed in step (c) to an etchant so as to remove material thereof down to the top surface of said field insulator layer.

13. A method according to claim 9, wherein said second aperture is formed so as to overlap said first aperture and intersect spaced-apart sidewalls of said conductive layer, thereby exposing respective spaced-apart planar surface regions of said substrate adjacent to the sidewalls of said conductive layer.

14. A semiconductor device comprising:

a semiconductor substrate having an effectively planar surface;

a field insulator layer of substantially uniform thickness formed on the surface of said substrate and having an aperture therein extending to said surface of said substrate, said aperture having a first aperture portion sidewalls of which define a first perimeter confining a first surface area of said substrate, and a second aperture portion sidewalls of which define a second perimeter extending from said first perimeter confining a second surface area of said substrate; and a gate insulator layer formed on a portion of said first surface area and the entirety of said second surface area of said substrate; and a gate electrode layer formed on said gate insulator layer and having a top surface effectively coplanar with the top surface of said field insulator layer and a portion of the sidewalls of said gate electrode layer being contiguous with sidewalls of said field insulator layer confining said second surface area of said substrate.

15. A semiconductor device according to claim 14, further comprising a conductive interconnect layer formed on said field insulator layer and being electrically connected to said gate electrode layer.

16. A semiconductor device according to claim 15, wherein said second aperture portion of said field insulator layer is defined by first and second aperture regions extending from opposite sidewalls of said field insulator layer defining said first aperture portion, such that sidewalls of said gate electrode layer are contiguous with sidewalls of said field insulator layer extending from said opposite sidewalls thereof.

17. A semiconductor device according to claim 14, wherein the sidewalls of said field insulator layer confining said first and second aperture portions are effectively perpendicular to the planar surface of said substrate.

* * * * *